United States Patent [19]

Hinooka

[11] Patent Number: 5,182,621
[45] Date of Patent: Jan. 26, 1993

[54] INPUT PROTECTION CIRCUIT FOR ANALOG/DIGITAL CONVERTING SEMICONDUCTOR

[75] Inventor: Kiyonobu Hinooka, Tokyo, Japan

[73] Assignee: NEC Corporation, Tokyo, Japan

[21] Appl. No.: 677,618

[22] Filed: Mar. 27, 1991

Related U.S. Application Data

[63] Continuation of Ser. No. 365,954, Jun. 14, 1989, abandoned.

[30] Foreign Application Priority Data

Jun. 14, 1988 [JP] Japan ................. 63-147205

[51] Int. Cl.[5] ............... H01L 29/06; H01L 29/78; H01L 27/02
[52] U.S. Cl. ................. 257/546; 257/357; 257/369
[58] Field of Search ............ 357/23.13, 42, 52

[56] References Cited

U.S. PATENT DOCUMENTS

| | | | |
|---|---|---|---|
| 4,609,931 | 9/1986 | Koike | 357/23.13 |
| 4,616,243 | 10/1986 | Minato et al. | 357/23.13 |
| 4,733,285 | 3/1988 | Ishioka et al. | 357/23.13 |
| 4,736,271 | 4/1988 | Mack et al. | 361/91 |
| 4,821,089 | 4/1989 | Straus | 357/68 |

OTHER PUBLICATIONS

*Webster's II New Riverside Univ. Dict.*, p. 78, 1984.
Muller et al, *Device Electronics for IC's*, 1986 pp. 454-465.

*Primary Examiner*—Andrew J. James
*Assistant Examiner*—Stephen D. Meier
*Attorney, Agent, or Firm*—Laff, Whitesel, Conte & Saret

[57] ABSTRACT

An A/D converter in the form of a complementary MOS integrated circuit and having a plurality of input channels. The input circuit includes a plurality of input protection circuits corresponding to the input channels. Each of the input protection circuits comprises an analog input terminal to be connected to receive an analog voltage signal, and a first semiconductor active element formed within a first conduction type island formed in the semiconductor substrate. The first semiconductor active element has one end connected to the input terminal and a second end connected to a first wiring conductor for a first voltage. The first semiconductor active element operates to discharge a first excessive voltage to the first wiring conductor when the first excessive voltage is applied to the input terminal. Each of the input protection circuits also comprises a second semiconductor active element formed within a second conduction type island formed in the semiconductor substrate, separately from the first island. The second semiconductor active element has one end connected to the input terminal and a second end connected to a second wiring conductor for a second voltage different from the first voltage. The second semiconductor active element operates to discharge a second excessive voltage to the second wiring conductor when the second excessive voltage is applied to the input terminal. The first semiconductor active elements and the second semiconductor active elements of all the input protection circuits are alternately located in such a manner that one first semiconductor active element is located between a pair of second semiconductor active elements and one second semiconductor active element is located between a pair of first semiconductor active elements.

1 Claim, 7 Drawing Sheets

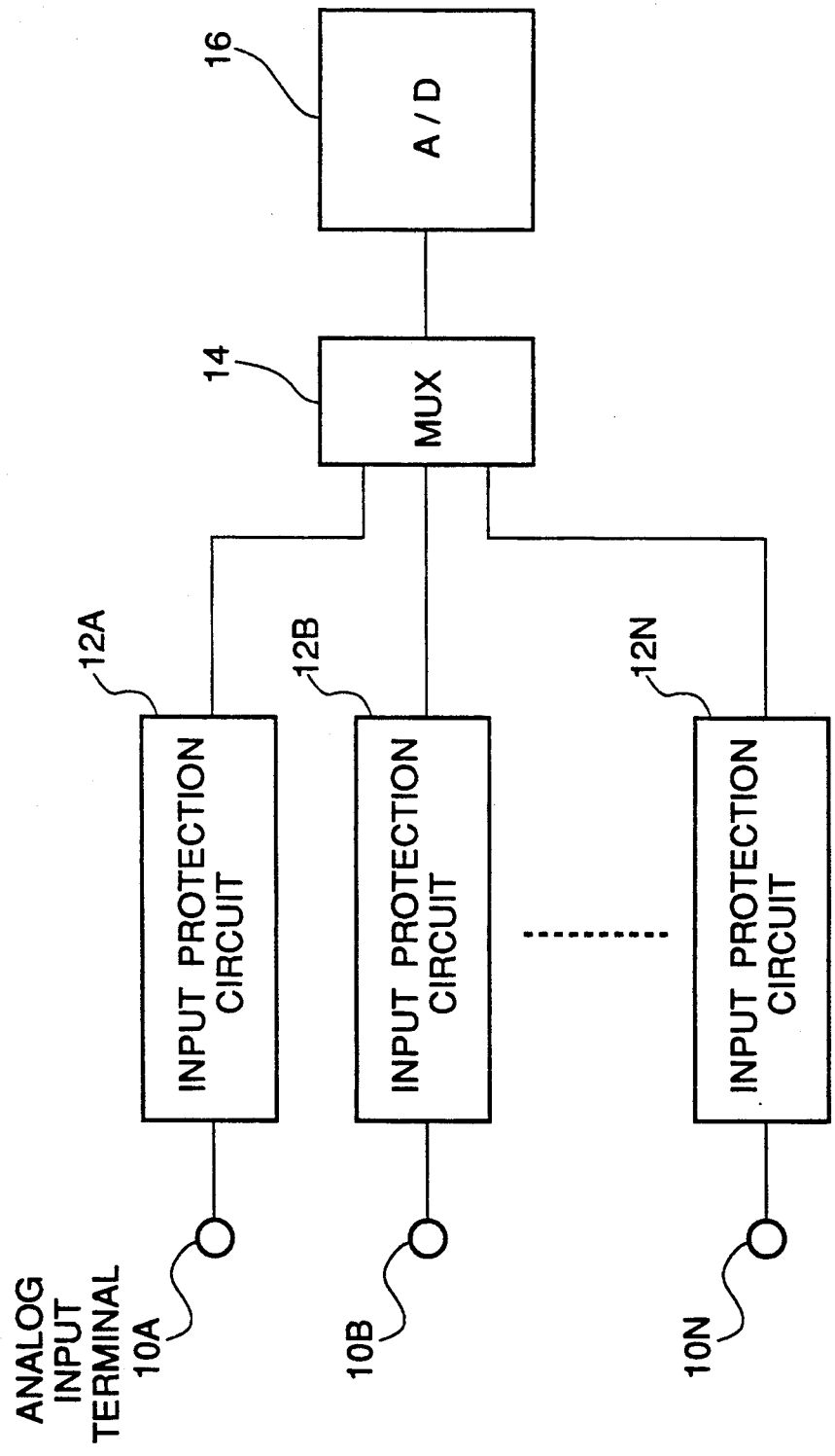

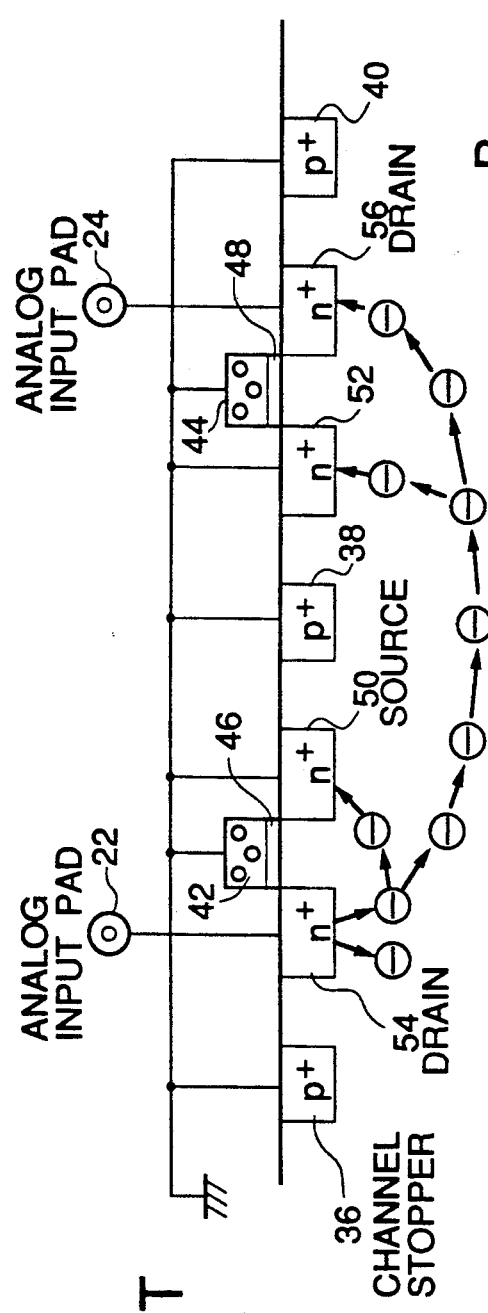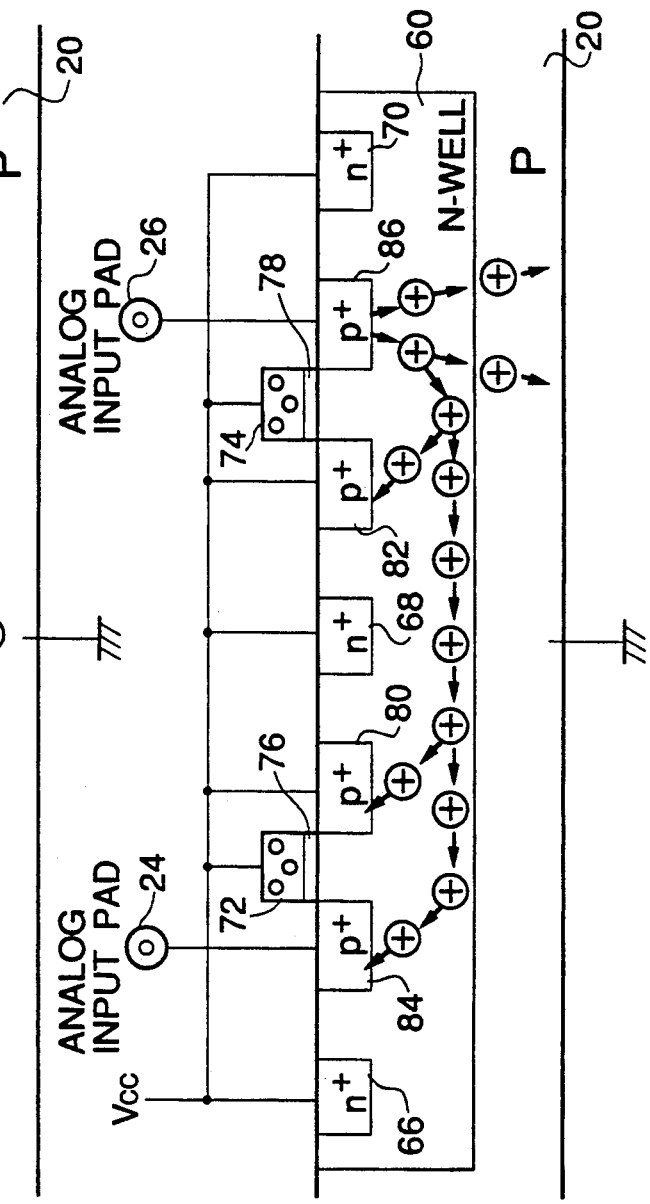
FIGURE 4
PRIOR ART
FIGURE 5
PRIOR ART

- ▭ DIFFUSION REGION
- ▨ WIRING Al
- • CONTACT BETWEEN DIFFUSION REGION AND WIRING Al
- ⊙ CONTACT BETWEEN POLY-Si AND WIRING Al
- ▭°°▭ POLY-Si RESISTER
- ⌐ ¬ N-WELL

5,182,621

INPUT PROTECTION CIRCUIT FOR ANALOG/DIGITAL CONVERTING SEMICONDUCTOR

This application is a continuation of application No. 07/365,954, filed Jun. 14, 1989, now abandoned.

BACKGROUND OF THE INVENTION

1. Field of the invention

The present invention relates to an analog/digital converting semiconductor integrated circuit, and more specifically to an improved layout of an input protection circuit for an analog/digital (A/D) converter in the form of an integrated circuit composed of complementary metal-oxide-semiconductor (MOS) transistors formed on a semiconductor substrate.

2. Description of related art

Recently, A/D converters which are composed of complementary MOS transistors formed on a semiconductor substrate have been improved to realize a high speed operation and a high precision. On the other hand, the A/D converters have been often used in a noisy environment, for example for control of engines of automobiles. In many cases, the A/D converters has a plurality of selectable analog input channels. In the case that the A/D converter having a plurality of selectable analog input channels is used in the noisy environment, noise will intrude from a non-selected analog input channel into a selected analog input channel, with the result that the precision of the A/D conversion will remarkable decrease.

This adverse influence to the A/D conversion precision due the noise will become further remarkable if the A/D convertor has a higher conversion precision. At present, it is estimated that the A/D conversion precision will be made further higher in the future, and therefore, the adverse influence of noise will become more significant. In the A/D converter, accordingly, it is an important current problem awaiting to be solved, to effectively suppress the influence of a noise intruded from a non-selected channel.

SUMMARY OF THE INVENTION

Accordingly, it is an object of the present invention to provide an A/D converter which has overcome the above mentioned defect of the conventional one.

Another object of the present invention is to provide an input protection circuit for an A/D converter having a plurality of input channels, capable of effectively preventing the influence of a noise intruded from a non-selected channel.

The above and other objects of the present invention are achieved in accordance with the present invention by an input circuit for an A/D converter in the form of a complementary MOS integrated circuit and having a plurality of input channels. The input circuit includes a plurality of input protection circuits corresponding to the input channels. Each of the input protection circuits comprises an analog input terminal to be connected to receive an analog voltage signal, and a first semiconductor active element formed within a first conduction type island formed in the semiconductor substrate. The first semiconductor active element has one end connected to the input terminal and a second end connected to a first wiring conductor for a first voltage. The first semiconductor active element operates to discharge a first excessive voltage to the first wiring conductor when the first excessive voltage is applied to the input terminal. Each of the input protection circuits also comprises a second semiconductor active element formed within a second conduction type island formed in the semiconductor substrate, separately from the first island. The second semiconductor active element has one end connected to the input terminal and a second end connected to a second wiring conductor for a second voltage different from the first voltage. The second semiconductor active element operates to discharge a second excessive voltage to the second wiring conductor when the second excessive voltage is applied to the input terminal. The first semiconductor active elements and the second semiconductor active elements of all the input protection circuits are alternately located in such a manner that one first semiconductor active element is located between a pair of second semiconductor active elements and one second semiconductor active element is located between a pair of first semiconductor active elements.

The above and other objects, features and advantages of the present invention will be apparent from the following description of preferred embodiments of the invention with reference to the accompanying drawings.

BRIEF DESCRIPTION OF THE DRAWINGS

FIG. 1 is a block diagram of a conventional A/D converter having a plurality of input channels;

FIG. 4 is a diagrammatic sectional view taken along the line A—A in FIG. 3;

FIG. 5 is a diagrammatic sectional view taken along the line B—B in FIG. 3;

DESCRIPTION OF THE PREFERRED EMBODIMENTS

Referring to FIG. 1, there is shown a diagram of a conventional A/D converter having a plurality of input channels. The shown A/D converter includes a plurality of analog input terminals 10A, 10B, ..., 10N, which are respectively connected to receive different analog signals. These input terminals 10A, 10B, ..., 10N are connected to inputs of a correspondingly number of input protection circuits 12A, 12B, ..., 12 N, respectively. Outputs of the input protection circuits 12A, 12B, ..., 12N are coupled to a multiplexor 14, which is in turn connected at its output to an A/D converting circuit 16.

Figure 2A:
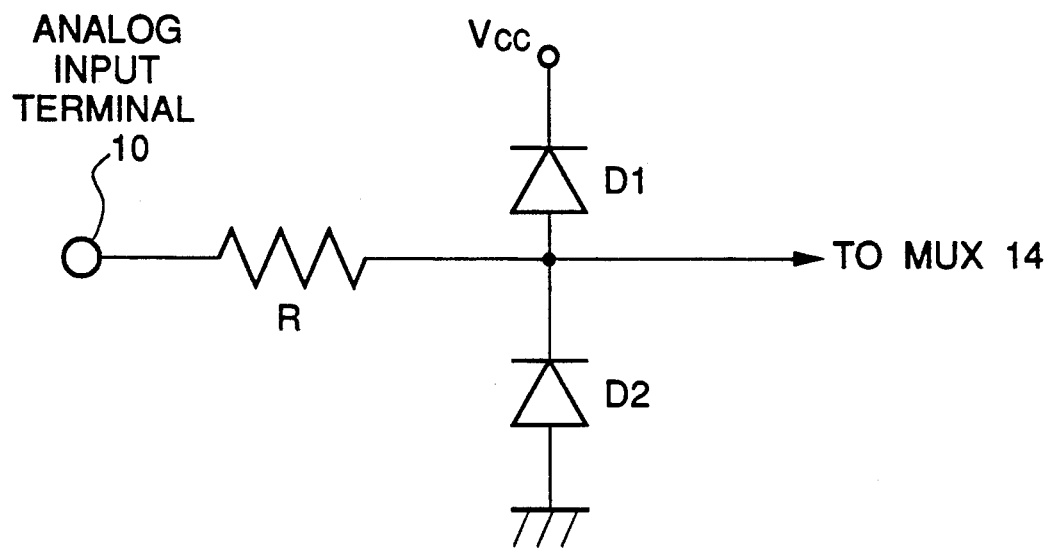
FIGS. 2A and 2B are circuit diagrams showing typical conventional input protection circuits.
Figure 2B:
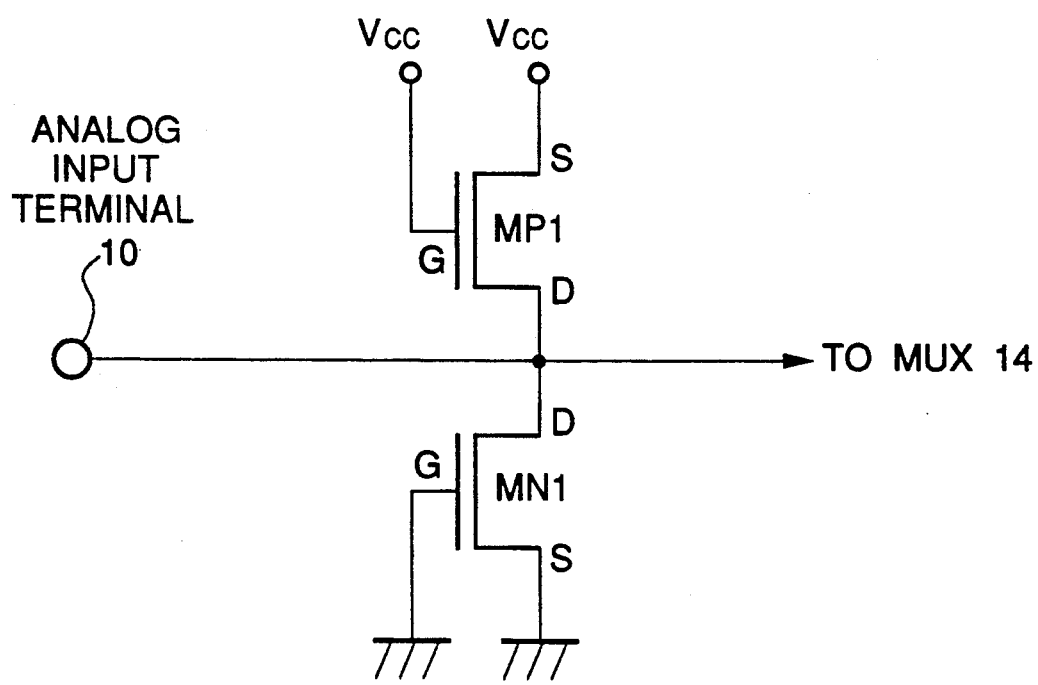

In the case that the above mentioned A/D converter is assembled in the form of a complementary MOS integrated circuit, each of the input protection circuits 12A, 12B, ..., 12N has been designed, for example, as shown in FIGS. 2A and 2B.

The input protection circuit shown in FIG. 2A includes a resister R having one end thereof connected to an analog input terminal 10. The other end of the resister R is connected to a connection node between a pair of diodes D1 and D2 series-connected to each other in the same direction. The diode D1 whose anode is connected to the resister R is connected at its cathode to a voltage supply potential Vcc, and the diode D2 whose cathode is connected to the resister R is connected at its anode to ground. The connection node between the pair of diodes D1 and D2 is connected to a corresponding one input of the multiplexor 14 shown in FIG. 1.

The input protection circuit shown in FIG. 2B includes a p-channel transistor MP1 and an n-channel transistor MN1 having their drains commonly connected to the analog input terminal 10. A gate and a source of the p-channel transistor MP1 are connected to a voltage supply potential Vcc, and a gate and a source of the n-channel transistor MN1 are connected to ground. Therefore, the two transistors are maintained off unless an excessive positive or negative voltage is inputted to the input terminal. The commonly connected drains of the p-channel transistor MP1 and the n-channel transistor MN1 are connected to a corresponding one input of the multiplexor 14 shown in FIG. 1.

Figure 3:
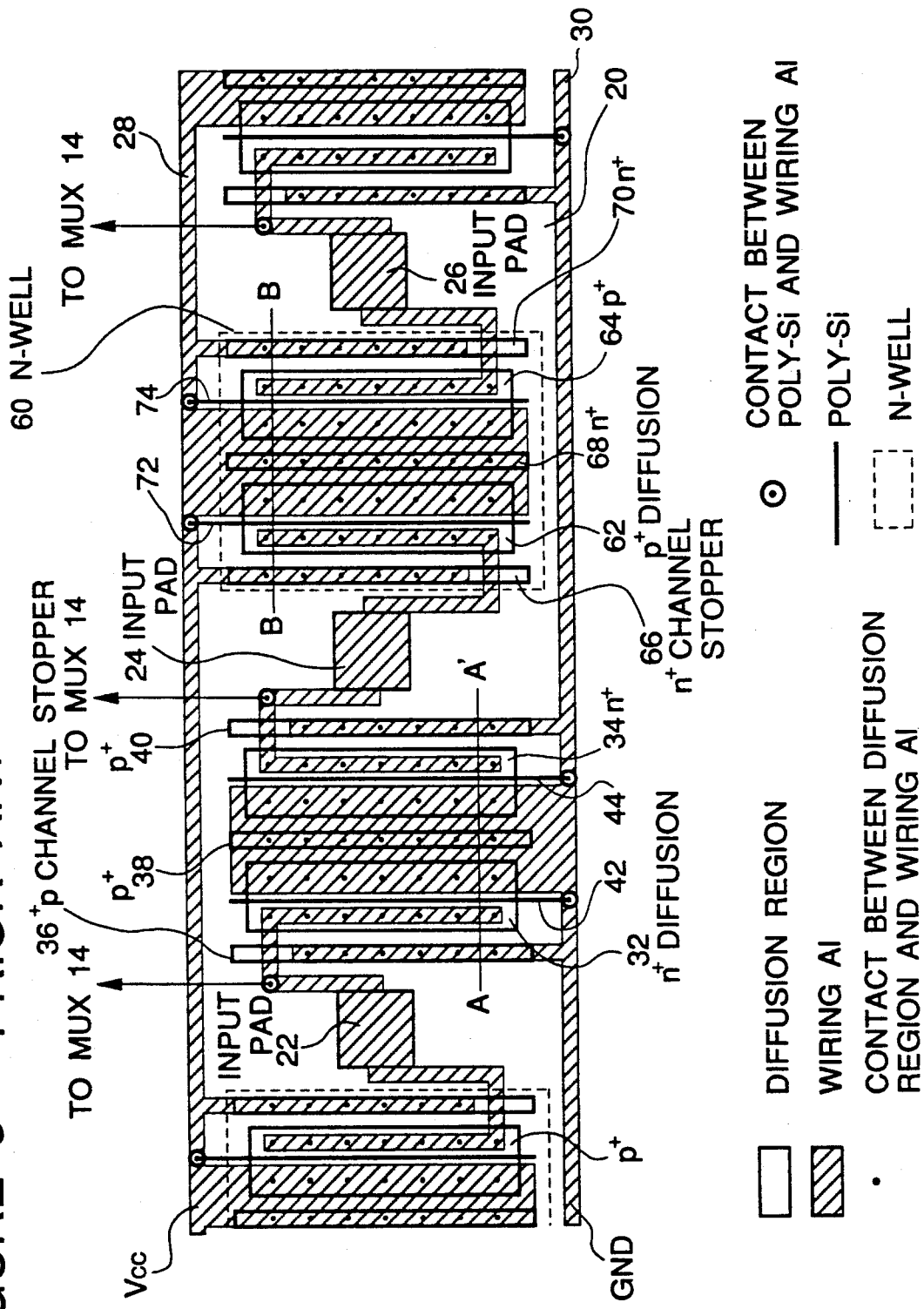
FIG. 3 illustrates a layout pattern of the conventional input protection circuit.

For example, if the input protection circuit shown in FIG. 2B are laid out on a semiconductor substrate, a layout pattern shown in FIG. 3 has been often adopted in the prior art. Furthermore, diagrammatic sectional views taken along the line A—A and the line B—B in FIG. 3 are shown in FIGS. 4 and 5, respectively.

Namely, the shown circuit includes a P-type semiconductor substrate 20 and three analog input pads 22, 24 and 26 formed thereon separately from one another. Required p-channel transistors and n-channel transistors are arranged in such a manner that each input pad has as its one side associated p-channel transistor connected thereto and at its other side one associated n-channel transistor connected thereto, and a pair of n-channel transistors are located between a pair of adjacent input pads (22 and 24) and a pair of p-channel transistors are located between another pair of adjacent input pads (24 and 26).

The substrate 20 includes a wiring conductor 28 made of for example aluminum and deposited along an upper edge of the substrate for a voltage supply potential Vcc, and another wiring conductor 30 of aluminum deposited along a lower edge of the substrate for ground GND.

Between the input pads 22 and 24, there are formed a pair of n+ diffusion regions 32 and 34 which are separated or confined by channel stoppers 36, 38 and 40 formed of p+ diffusion regions. Gate electrodes 42 and 44 are respectively formed through gate insulators 46 and 48 on the n+ diffusion regions 32 and 34 to vertically extend on a center of the n+ diffusion regions. Each of the gate electrodes 42 and 44 is formed of a polysilicon layer which extends to the ground aluminum wiring conductor 30 and is connected to the ground aluminum wiring conductor 30 by a contact shown by a center dotted small circle in FIG. 3. The channel stoppers 36, 38 and 40, a portion 50 of the n+ diffusion region 32 positioned at a right side of the gate electrode 42, and a portion 52 of the n+ diffusion region 34 positioned at a left side of the gate electrode 44 are covered by a wiring conductor extending from the ground conductor 30. The diffusion regions 32, 34, 36, 38 and 40 and the covering aluminum ground wiring conductor are interconnected by a plurality of contacts shown by dots in FIG. 3. In addition, a portion 54 of the n+ diffusion region 32 positioned at a left side of the gate electrode 42, and a portion 56 of the n+ diffusion region 34 positioned at a right side of the gate electrode 44 are covered by a wiring conductors extending to the input pads 22 and 24, respectively. The diffusion regions 32 and 34 and the covering aluminium wiring conductor are interconnected by a plurality of contacts shown by dots in FIG. 3. With this arrangement, the portions 50 and 52 form source regions of the n-channel transistors connected to the ground, respectively and portions 54 and 56 form a drain region of the n-channel transistors connected to the input pads 22 and 24, respectively.

Between the input pads 24 and 26 there is formed a n-well 60 is formed, in which a pair of p+ diffusion regions 62 and 64 which are separated or confined by channel stoppers 66, 68 and 70 formed of n+ diffusion regions. Gate electrodes 72 and 74 are formed through gate insulators 76 and 78 on the p+ diffusion regions 62 and 64 to vertically extend on a center of the p+ diffusion regions. Each of the gate electrodes 72 and 74 is formed of a polysilicon layer which extends to the Vcc aluminum wiring conductor 28 and is connected to the Vcc aluminium wiring conductor 28 by a contact shown by a center dotted small circle in FIG. 3. The channel stoppers 66, 68 and 70, a portion 80 of the p+ diffusion region 62 positioned at a right side of the gate electrode 72, and a portion 82 of the p+ diffusion region 64 positioned at a left side of the gate electrode 74 are covered by a wiring conductor extending from the Vcc wiring conductor 28. The diffusion regions 62, 64, 66, 68 and 70 and the covering aluminum Vcc wiring conductor are interconnected by a plurality of contacts shown by dots in FIG. 3. In addition, a portion 84 of the p+ diffusion region 62 positioned at a left side of the gate electrode 72, and a portion 76 of the p+ diffusion region 64 positioned at a right side of the gate electrode 74 are covered by a wiring conductors extending to the input pads 24 and 26, respectively. The diffusion regions 62 and 64 and the covering aluminum wiring conductor are interconnected by a plurality of contacts shown by dots in FIG. 3. With this arrangement, the portions 80 and 82 form source regions of the p-channel transistors connected to the ground, respectively, and portions 84 and 86 form a drain region of the p-channel transistors connected to the input pads 24 and 26, respectively.

When the A/D converter is actually used, one analog input channel is selected among a plurality of analog input channels, and the A/D converter converts into a digital signal an input analog voltage which is supplied from an input pad connected to the selected input channel. Now, assume that the analog input pad 24 is selected. In this condition, of course, the other input pads including the input pads 22 and 26 are not selected. However, if a noise having a voltage lower than a ground level is inputted to the input pad 22, the n+ diffusion drain region 54 connected to the input pad 22 is biased in a forward direction to the p-substrate 20 maintained at the ground level. Therefore, electrons are injected into the substrate 20 from the n+ diffusion drain region 54 as illustrated in FIG. 4. These injected electrons will be absorbed by the other n+ diffusion regions 50, 52 and 56 by a bipolar action. A portion of the electrons absorbed by the n+ diffusion regions 50 and 52 will further flow into the ground GND having a low impedance, and therefore, will not give any influence on the G/D conversion operation. However, a portion of the electrons absorbed by the n+ diffusion region 56 connected to the selected input pad 24 will cause an error in and A/D conversion. In many cases, the analog input wirings are connected in series with a protective resister of 10 KΩ to 100 KΩ located externally of the semiconductor integrated circuit. Namely, the analog input is not necessarily of a low impedance, and therefore, if the absorbed electrons has injected into the selected input pad, a potential drop will appear across the external protective resister due to the flow of the absorbed electrons and is superimposed on the analog voltage signal inputted on the selected input pad 24. In other words, the voltage on the selected input pud 24 will become lower than that of a true analog signal inputted to the selected input pad. As a result, the decreased voltage is converted into a digital signal, with is no longer indicative of a digital value corresponding to the true analog signal inputted to the selected input pad. Namely, an error will occur in the A/D conversion.

On the other hand, assume that the analog input pad 24 is selected and a noise having a voltage higher than Vcc is inputted into the analog pad 26. If the voltage higher than Vcc is applied into the analog pad 26, the p+ diffusion region 86 connected to the analog pad 26 is biased in a forward direction to the N-well 60 maintained at the potential Vcc, and therefore, holes will be injected from the p+ diffusion region 86 to the N-well 60. These injected holes are diffused within the N-well 60, and a major portion of the injected holes will be further injected to the p-substrate 20. But, some portion of the injected holes will be absorbed to the p+ diffusion regions 82, 80 and 84 within the N-well 60. Holes absorbed to the p+ diffusion region 82 and 80 will flow into the Vcc having a low impedance, and therefore, will not give an adverse influence to the A/D conversion. But, holes absorbed to the p+ diffusion region 84 connected to the selected input pad 24 will give an adverse influence to the A/D conversion. Namely, the potential of the input pad 24 will be brought to a potential higher than a voltage of a true analog signal inputted to the selected input pad 24, and accordingly, an error of the A/D conversion will occur.

In the case that the input protection circuit composed of a pair of diodes D1 and D2 shown in FIG. 2A is integrated on a semiconductor substrate, the diode D1 connected to Vcc is formed of a p+/n junction and the diode D2 connected to ground is formed of a n+/p junction. In the prior art, the p+/n diodes and the n+/p diodes have been arranged in such a manner that each input pad has at its one side one associated p+/n diode connected thereto and at its other side one associated n+/p diode connected thereto, and a pair of p+/n diodes are located adjacent to each other and a pair of n+/p diodes are located adjacent to each other so that the p+/n diode pairs and the p+/n diode pairs are alternately arranged. In this case, if a noise having a voltage lower than the ground level or higher than the Vcc level is inputted to a non-selected input pad, an A/D conversion an error will occur, similarly to the layout shown in FIG. 3.

Figure 6:
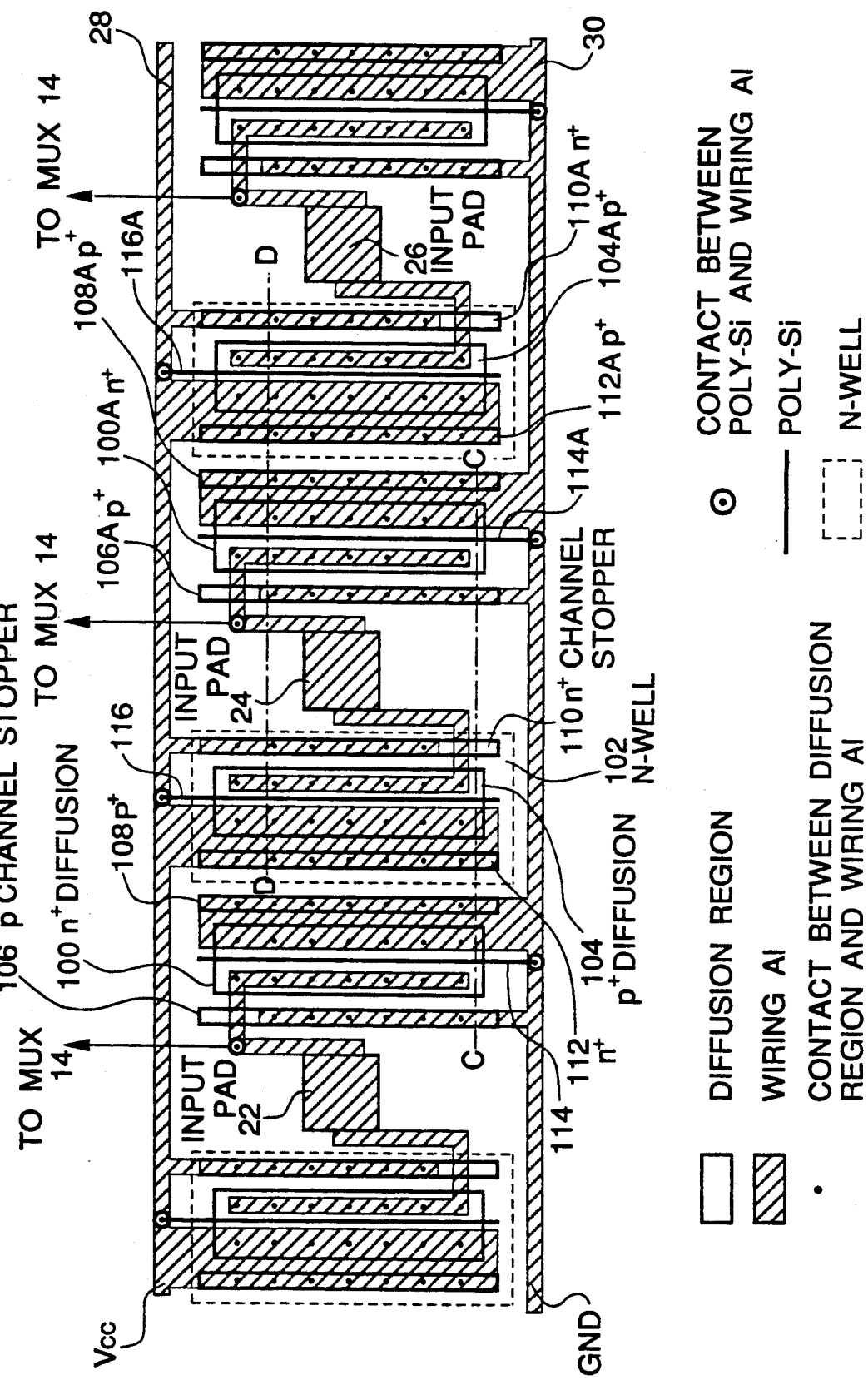
FIG. 6 illustrates a layout pattern of one embodiment of the input protection circuit in accordance with the present invention.
Figure 7:
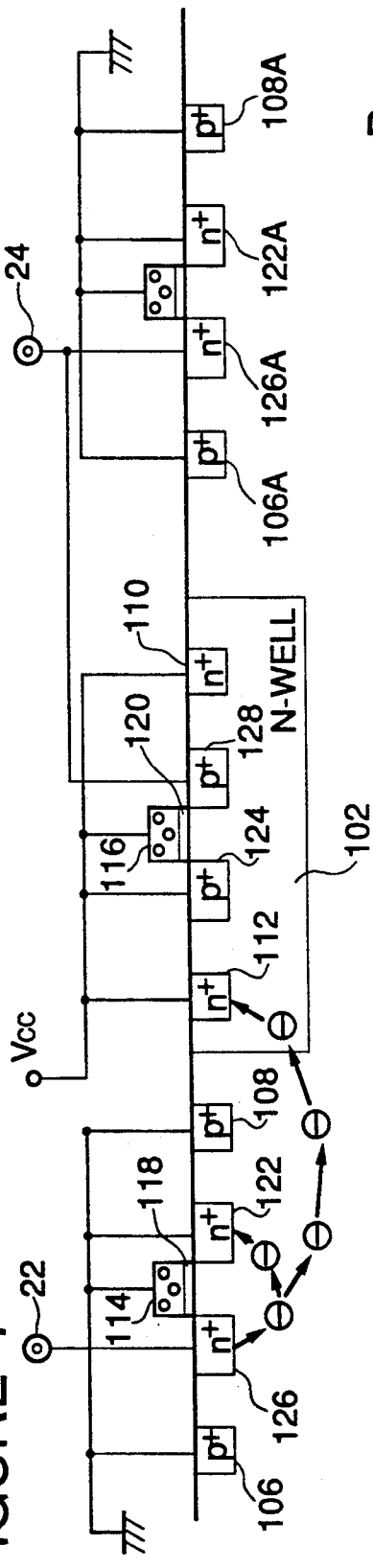
FIG. 7 is a diagrammatic sectional view taken along the line C—C in FIG. 6.
Figure 8:
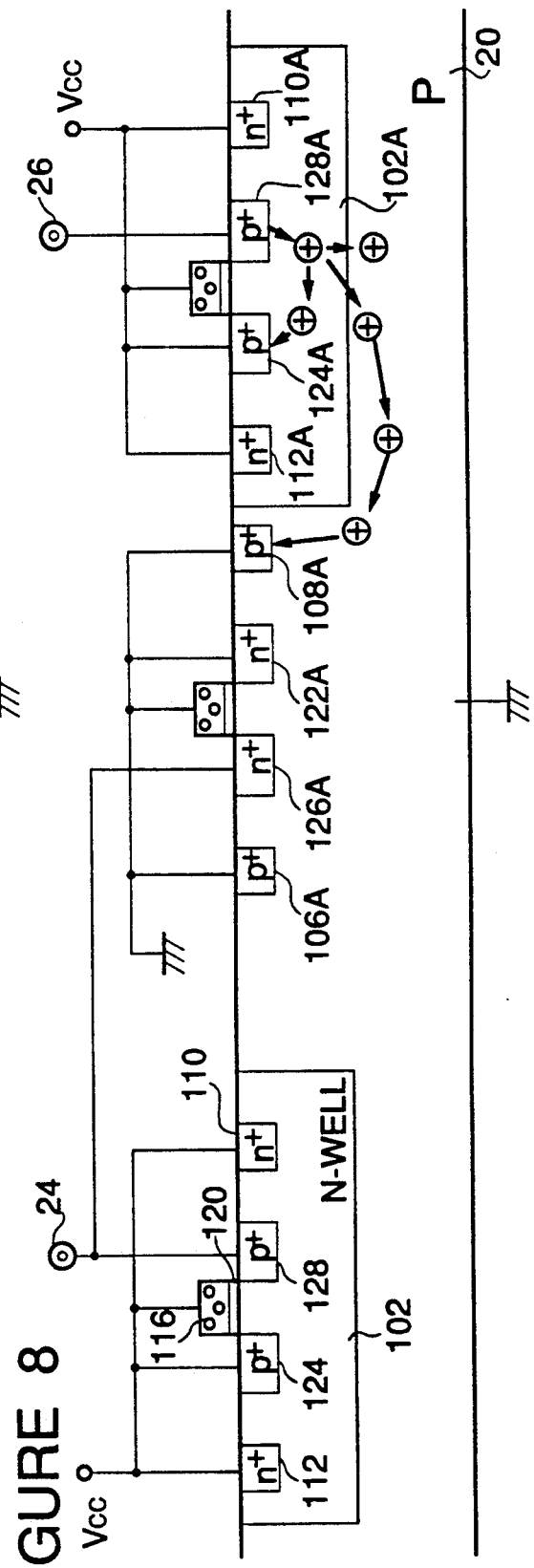
FIG. 8 is a diagrammatic sectional view taken along the line D—D in FIG. 6.

Referring to FIG. 6, there is shown a layout pattern of one embodiment of the input protection circuit in accordance with the present invention. FIG. 7 is a diagrammatic sectional view taken along the line C—C in FIG. 6 and FIG. 8 is a diagrammatic sectional view taken along the line D—D in FIG. 6.

The layout pattern shown in FIG. 5 realizes the input protection circuit shown in FIG. 2B. In the shown layout pattern, each input pad has at its one side one associated p-channel transistor connected thereto and at its other side one associated n-channel transistor connected thereto, similarly to the layout shown in FIG. 3, but a pair of n-channel transistor and p-channel transistor are located between each pair of adjacent input pads, in such a manner that one n-channel transistor is positioned between a pair of p-channel transistors and one p-channel transistor is positioned between a pair of n-channel transistors, differently from the layout shown in FIG. 3.

The substrate 20 includes an aluminum wiring conductor 28 for a voltage supply potential Vcc and deposited along an upper edge of the substrate, and another aluminum wiring conductor 30 deposited along a lower edge of the substrate for ground GND.

Between a pair of adjacent input pads 22 and 24, one n+ diffusion region 100 and one N-well 102 having therein one p+ diffusion region 100 are formed separately from each other. A pair of chemical stoppers 106 and 108 of p+ diffusion regions are formed on both sides of the n+ diffusion region 100. In addition, another pair of chemical stoppers 110 and 112 of n+ diffusion regions are formed on both sides of the p+ diffusion region 104 within the N-well 102. Gate electrodes 114 and 116 are formed through gate insulators 118 and 120 on the n+ diffusion region 100 and the p+ diffusion region 104 to vertically extend on a center of these diffusion regions. The gate electrodes 114 and 116 are formed of a polysilicon layer. The gate electrode 114 extends on the ground aluminum wiring conductor 30 and is connected to the ground aluminum wiring conductor 30 by a contact shown by a center dotted small circle in FIG. 6, and the gate electrode 116 extends to the Vcc aluminum wiring conductor 28 and is connected to the Vcc aluminum wiring conductor 28 by a contact shown by a center dotted small circle in FIG. 6.

The channel stoppers 106 and 108, and a portion 122 of the n+ diffusion region 100 positioned at a right side of the gate electrode 114 are covered by a wiring conductor extending from the ground conductor 30. The diffusion regions 106, 108, and 100 and the covering aluminum ground wiring conductor are interconnected by a plurality of contacts shown by dots in FIG. 6. The channel stoppers 110 and 112 and a portion 124 of the p+ diffusion region 104 positioned at a left side of the gate electrode 116 are covered by a wiring conductor extending from the Vcc wiring conductor 28. The diffusion regions 110 and 112 and the covering aluminum Vcc wiring conductor are interconnected by a plurality of contacts shown by dots in FIG. 6.

In addition, a portion 126 of the n+ diffusion region 100 positioned at a left side of the gate electrode 114 is covered by a wiring conductor extending to the input pad 22. A portion 128 of the p+ diffusion region 104 positioned at a right side of the gate electrode 116 are covered by a wiring conductors extending to the input pad 24. The diffusion regions 100 and 104 and the covering aluminum wiring conductor are interconnected by a plurality of contacts shown by dots in FIG. 6.

With this arrangement, the portions 122 and 126 from a source region and a drain region of the n-channel transistor, respectively, and the portions 124 and 128 form a source region and a drain region of the p-channel transistors, respectively.

Between another pair of adjacent input pads 24 and 26, there are formed a pair of n-channel transistor and p-channel transistor, in the same manner as those formed between the pair of adjacent input pads 22 and 24. However, explanation thereof will be omitted by adding the same Reference Numerals having the suffix "A" to corresponding elements.

Now, assume that the analog input pad 24 is selected, and a noise having a voltage lower than a ground level is inputted to the non-selected input pad 22. The n+ diffusion drain region 126 connected to the input pad 22 is biased in a forward direction to the p-substrate 20 maintained at the ground level. Therefore, electrons are injected into the substrate 20 from the n+ diffusion drain region 126 as illustrated in FIG. 7. However, since the relatively deep N-well 102 is positioned between the n+ diffusion drain region 126 and the n+ diffusion drain region 126A connected to the selected input pad 24, a major portion of the electrons injected to the substrate 20 is absorbed by the N-well 102. Namely, the N-well 102 functions as a collector for electrons. The electrons absorbed by the N-well 102 are majority carriers within the N-well 102, and therefore, will flow into the channel stopper 110 and 112. Namely, the electrons absorbed by the N-well 102 will not exert any adverse influence. On the other hand, the amount of electrons absorbed to the n+ diffusion drain region 126A connected to the selected input pad 24 is remarkably decreased since the distance between the n+ diffusion drain region 126 connected to the non-selected input pad 22 and the n+ diffusion drain region 126A connected to the selected input pad 24 is elongated in comparison with that of the conventional one shown in FIG. 3. According to the inventor's experiment, the amount of electrons absorbed to the n+ diffusion drain region 126A was decreased to about one-tenth of that of the conventional layout pattern.

Figure 9:
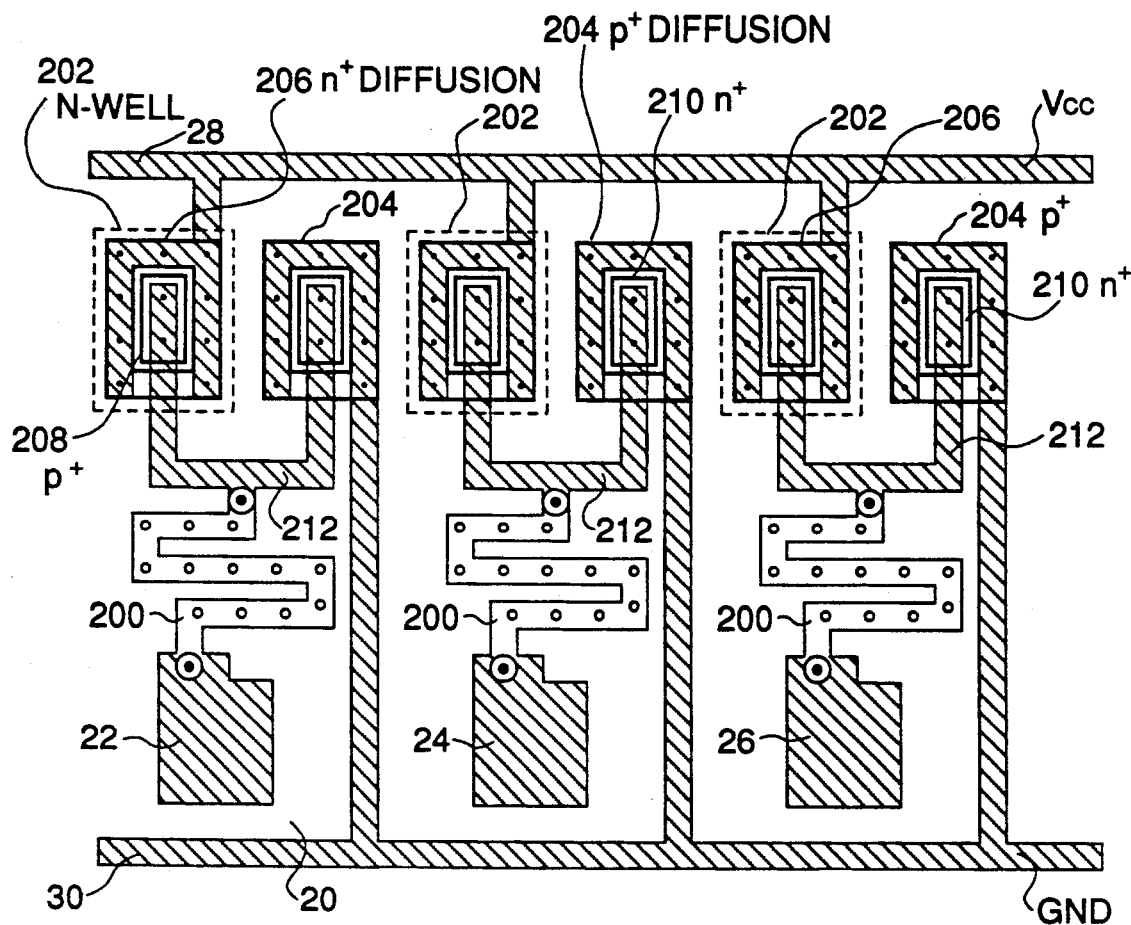
FIG. 9 illustrates a layout pattern of another embodiment of the input protection circuit in accordance with the present invention.

On the other hand, assume that the analog input pad 24 is selected and a noise having a voltage higher than Vcc is inputted into the analog pad 26. In this case, holes will be injected through the p+ diffusion region 128A to the N-well 102A. These injected holes are diffused within the N-well 102A, and further into the P-substrate 20. The holes injected into the substrate will be absorbed by the channel stoppers 106A and 108A. Therefore, no influence will appear. On the other hand, since the p+ diffusion region 128 connected to the selected input pad 24 is formed within the N-well 102 which is independent of the N-well 102A injected with the holes, the holes which are majority carriers within the substrate 20 will not intrude into the N-well 102 because of a potential difference between the N-well 102 and the P-substrate 20. Therefore, the noise having a voltage higher than Vcc and inputted to a non-selected input pad is completely prevented Turning to FIG. 9, there is a layout pattern of another embodiment of the input protection circuit in accordance with the present invention, which realizes the input protection circuit shown in FIG. 2A. Namely, each protection circuit is composed of a n+/p diode and a p+/n diode.

In the second embodiment, the P-substrate 20 includes a wiring conductor 28 of aluminum deposited along an upper edge of the substrate for a voltage supply potential Vcc, and another wiring conductor 30 of aluminum deposited along a lower edge of the substrate for ground GND.

Three input pads 22, 24 and 26 are formed on the substrate 20 separately from one another. Each of the input pads is connected to one end of a corresponding polysilicon resister 200 also formed on the substrate 20.

The P-substrate 20 has N-wells 202 and p+ diffusion regions 204 which are located alternately in a direction along the Vcc wiring conductor 28 and in proximity of but separately from the Vcc wiring conductor 28. Within each of the N-wells 202, there is formed a n+ diffusion region 206 which is connected to the Vcc wiring conductor 28. Within the n+ diffusion region 206, furthermore, a p+ diffusion region 208 is formed, so that a p+/n diode is formed of the n+ diffusion region 206 and the p+ diffusion region 208. On the other hand, within the p+ diffusion region 204, and n+ diffusion region 210 is further formed, so that an n+/p diode is formed of the p+ diffusion region 204 and the n+ diffusion region 210. The p+ diffusion region 204 is connected to the ground wiring conductor 20. The p+ diffusion region 208 and the n+ diffusion region 210 are connected through a wiring conductor 212 to the other end of the corresponding resistor 200.

This arrangement can have the same effect in preventing the influence of a noise inputted to a non-selected input pad, as that obtained in the first embodiment. This will be easily understood from the explanation of the first embodiment, by considering the face that the n-channel MOS transistor and the p-channel MOS transistor are replaced with the n+ diffusion region of the n+/p diode and the p+ diffusion region of the p+/n diode.

The invention has thus been shown and described with reference to the specific embodiments. However, it should be noted that the present invention is in no way limited to the details of the illustrated structures but changes and modifications may be made within the scope of the appended claims.

I claim:

1. An input circuit having a plurality of input protection circuits for a corresponding number of input channels, the input circuit being formed on a semiconductor substrate having a p-type conductivity, each of the input protection circuits comprising:
   an analog input terminal (24) which is to be connected to receive an analog voltage signal;
   a first wiring conductor for a first voltage (Vcc);
   a second wiring conductor for a second voltage (GND) which is lower than said first voltage;
   a p-channel MOS field effect transistor formed in an independent n-type region (102) formed in said semiconductor substrate and having a drain (128) connected to said input terminal (24) and a gate (116) and a source (124) connected in common to said first wiring conductor, said p-channel MOS field effect transistor operating to discharge a first excessive voltage to said first wiring conductor when said first excessive voltage is applied to said input terminal, said p-channel MOS field effect transistor also including a pair of channel stoppers (110 and 112) formed within said independent n-type region (102) and respectively located at the outside of said source and said drain, said pair of channel stoppers being connected to said first wiring conductor; and
   an n-channel MOS field effect transistor formed in a p-type region in said semiconductor substrate, and having a drain (126A) connected to said input terminal (24) and a gate and a source (122A) connected to said second wiring conductor, said n-channel MOS field effect transistor operating to discharge a second excessive voltage to said second wiring conductor when said second excessive voltage is applied to said input terminal, said n-channel MOS field effect transistor also including a pair of channel stoppers (106A and 108A) formed within said p-type region in said semiconductor substrate and respectively located at the outside of said source and said drain, said pair of channel stoppers being connected to said second wiring conductor, said p-channel MOS field effect transistor formed in said n-type region and said n-channel MOS field effect transistor formed in said p-type region of all the input protection circuits being alternately located in such a manner that only one p-channel MOS field effect transistor is located between a pair of n-channel MOS field effect transistors and only one n-channel MOS field effect transistor is located between a pair of p-channel MOS field effect transistors, whereby each adjacent MOS field effect transistors is an opposite conduction type with respect to the conduction type of its neighboring transistors, and said drain (128) of said p-channel MOS field effect transistor in each input protection circuit being located farther than said source (124) of the same p-channel MOS field effect transistor from the drain (126) of the n-channel MOS field effect transistor of an adjacent input protection circuit, and said drain (126A) of said n-channel MOS field effect transistor in each input protection circuit being located farther than said source (122A) of the same n-channel MOS field effect transistor from the drain (126) of the p-channel MOS field effect transistor of another adjacent input protection circuit.

* * * * *